US010128274B2

(12) United States Patent
Jeong

(10) Patent No.: US 10,128,274 B2
(45) Date of Patent: Nov. 13, 2018

(54) THIN FILM TRANSISTOR ARRAY PANEL AND A METHOD FOR MANUFACTURING THE SAME

(71) Applicant: SAMSUNG DISPLAY CO., LTD., Yongin-si, Gyeonggi-Do (KR)

(72) Inventor: Jae Woo Jeong, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/434,374

(22) Filed: Feb. 16, 2017

(65) Prior Publication Data

US 2017/0263646 A1    Sep. 14, 2017

(30) Foreign Application Priority Data

Mar. 11, 2016   (KR) .................. 10-2016-0029842

(51) Int. Cl.
*H01L 27/12*    (2006.01)
*H01L 21/311*    (2006.01)
(Continued)

(52) U.S. Cl.
CPC .......... *H01L 27/124* (2013.01); *H01L 21/308* (2013.01); *H01L 21/3081* (2013.01); *H01L 21/3083* (2013.01); *H01L 21/31144* (2013.01); *H01L 21/32* (2013.01); *H01L 21/3205* (2013.01); *H01L 21/469* (2013.01);
(Continued)

(58) Field of Classification Search
CPC ............... H01L 21/308; H01L 21/3081; H01L 21/3083; H01L 21/31; H01L 21/31144; H01L 21/32; H01L 21/3205; H01L 21/469–21/47576; H01L 29/4908; H01L 27/1262; H01L 27/1248; H01L 27/1288; H01L 27/3248; H01L 27/3276
See application file for complete search history.

(56) References Cited

U.S. PATENT DOCUMENTS

2016/0043226 A1*  2/2016  Yoon .................. H01L 29/7869
349/47

FOREIGN PATENT DOCUMENTS

KR    1020000047012    7/2000
KR    1020070091732    9/2007
KR    1020140072253    6/2014

* cited by examiner

*Primary Examiner* — Thanhha Pham
(74) *Attorney, Agent, or Firm* — F. Chau & Associates, LLC

(57) ABSTRACT

A thin film transistor array panel including: a substrate; a semiconductor layer disposed on the substrate; a source electrode and a drain electrode overlapping the semiconductor layer, and a gate electrode overlapping the semiconductor layer; and a first ohmic contact disposed between the semiconductor layer and the source electrode and a second ohmic contact disposed between the semiconductor layer and the drain electrode. The semiconductor layer includes a channel part that does not overlap the source electrode and the drain electrode. The first ohmic contact includes a first edge and the second ohmic contact includes a second edge. The first and second edges face each other across the channel part of the semiconductor layer. The first edge of the first ohmic contact is protruded from the source electrode toward the channel part and the second edge of the second ohmic contact is protruded from the drain electrode toward the channel part.

13 Claims, 29 Drawing Sheets

(51) Int. Cl.
*H01L 21/32* (2006.01)
*H01L 21/469* (2006.01)
*H01L 29/49* (2006.01)
*H01L 21/308* (2006.01)
*H01L 27/32* (2006.01)
*H01L 21/3205* (2006.01)

(52) U.S. Cl.
CPC ...... *H01L 27/1248* (2013.01); *H01L 27/1262* (2013.01); *H01L 27/1288* (2013.01); *H01L 27/3248* (2013.01); *H01L 27/3276* (2013.01); *H01L 29/4908* (2013.01)

THIN FILM TRANSISTOR ARRAY PANEL AND A METHOD FOR MANUFACTURING THE SAME

CROSS-REFERENCE TO RELATED APPLICATION

This application claims priority under 35 U.S.C. § 119 to Korean Patent Application No. 10-2016-0029842 filed in the Korean Intellectual Property Office on Mar. 11, 2016, the disclosure of which is incorporated by reference herein in its entirety.

TECHNICAL FIELD

The present invention relates to a thin film transistor array panel and a manufacturing method thereof.

DESCRIPTION OF THE RELATED ART

A liquid crystal display (LCD) is one of the most common types of flat panel displays.

The LCD includes a pixel electrode, a common electrode and a liquid crystal layer disposed therebetween. The LCD applies voltages to the pixel electrode and the common electrode to rearrange liquid crystal molecules of the liquid crystal layer, thereby controlling an amount of transmitted light and consequently the display of an image.

The pixel electrode is connected to a switching element such as a thin film transistor to receive a data voltage. When forming a channel of the thin film transistor, some of the metal used to make a source electrode and a drain electrode may flows into the channel, thereby contaminating the channel, and consequently degrading the performance of the thin film transistor.

SUMMARY

A thin film transistor array panel according to an exemplary embodiment of the present invention includes: a substrate; a semiconductor layer disposed on the substrate; a source electrode and a drain electrode overlapping the semiconductor layer, and a gate electrode overlapping the semiconductor layer; and a first ohmic contact disposed between the semiconductor layer and the source electrode and a second ohmic contact disposed between the semiconductor layer and the drain electrode, wherein the semiconductor layer includes a channel part that does not overlap the source electrode and the drain electrode, the first ohmic contact includes a first edge and the second ohmic contact includes a second edge, wherein the first and second edge face each other across the channel part of the semiconductor layer, and the first edge of the first ohmic contact is protruded away from the source electrode toward the channel part and the second edge of the second ohmic contact is protruded away from the drain electrode toward the channel part.

The first ohmic contact includes a third edge and the second ohmic contact includes a fourth edge, wherein the third edge overlaps an edge of the source electrode and the fourth edge overlaps an edge of the drain electrode, and the third edge of the first ohmic contact is protruded away from the first edge of the source electrode less than the first edge of the first ohmic contact is protruded away from the source electrode and the fourth edge of the second ohmic contact is protruded away from an edge of the drain electrode less than the second edge of the second ohmic contact is protruded away from the drain electrode.

A first edge of the source electrode has almost the same shape as a first edge of the semiconductor layer and a first edge of the drain electrode has almost the same shape as a second edge of the semiconductor layer.

The first edge of the source electrode and the first edge of the drain electrode may respectively overlap the first and second edges of the semiconductor layer.

A protection layer disposed at a side of the first edge of the source electrode and the first edge of the drain electrode may be further included, the protection layer may not be disposed at a side of a second edge of the source electrode and a second edge of the drain electrode facing each other across the channel part, and the protection layer may include a material that can be etched by the same etchant as that of the source electrode and the drain electrode.

The protection layer may include the same material as the gate insulating layer.

The protection layer may be disposed in the same layer as the first ohmic contact and the second ohmic contact.

A method for manufacturing a thin film transistor array panel according to an exemplary embodiment of the present invention includes: depositing a semiconductor layer on a substrate; depositing a metal layer overlapping the semiconductor layer with an insulating layer therebetween; first etching the metal layer; depositing a protection layer on the substrate to form a protection member at a side of the first-etched metal layer; etching the semiconductor layer; and second etching the metal layer.

The etching of the semiconductor layer may be performed after forming the protection member at the side of the first-etched metal layer, and the second-etching of the metal layer may be performed after etching the semiconductor layer.

The forming of the protection member at the side of the metal layer and the etching of the semiconductor layer may include dry etching the protection layer and the semiconductor layer together after depositing the protection layer.

The dry etching may be performed in a direction perpendicular to a surface of the substrate.

The dry etching may use an etching gas such as argon (Ar) or boron trichloride ($BCl_3$).

The second-etching of the metal layer may expose a channel part of the semiconductor layer.

The method may further include forming a semiconductor layer doped with an impurity semiconductor, and the second-etching of the metal layer may include simultaneously wet-etching the metal layer and the impurity doped semiconductor layer.

The depositing of the protection layer may include depositing a material that can be wet-etched by the same etchant as that of the source electrode and the drain electrode by a chemical vapor deposition (CVD) method.

The depositing of the protection layer may include depositing the same material as that of the impurity doped semiconductor layer.

The depositing of the protection layer may include depositing the same material as that of the insulating layer.

A thin film transistor array panel according to an exemplary embodiment of the present invention includes: a gate electrode disposed on a substrate; a drain electrode and a source electrode overlapping the gate electrode, wherein a channel part of a semiconductor layer is disposed between the drain electrode and the source electrode; a first ohmic contact overlapped by the drain electrode and protruded away from an edge of the drain electrode toward the channel part; and a second ohmic contact overlapped by source electrode and protruded away from an edge of the source electrode toward the channel part.

DETAILED DESCRIPTION OF THE EMBODIMENTS

Figure 1:
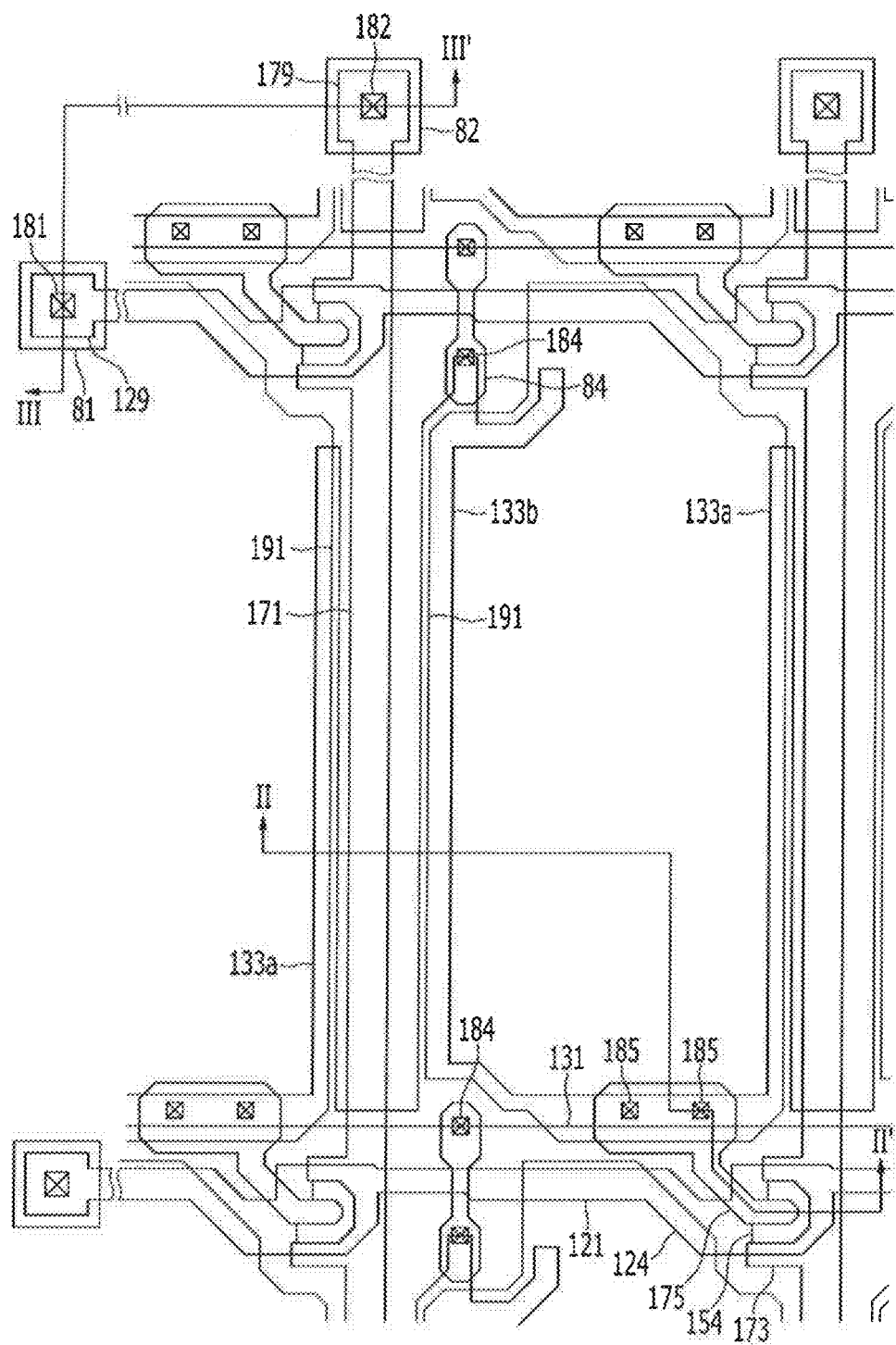
FIG. 1 is a layout view of a thin film transistor array panel according to an exemplary embodiment of the present invention.

Hereinafter, exemplary embodiments of the present invention will be described in detail with reference to the attached drawings. As those skilled in the art would realize, the described embodiments may be modified in various different ways, and thus, should not be limited to the embodiments set forth herein. Like reference numerals may designate like elements throughout the specification.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

First, a thin film transistor array panel according to an exemplary embodiment of the present invention will be described with reference to FIG. 1 to FIG. 3. FIG. 1 is a layout view of a thin film transistor array panel according to an exemplary embodiment of the present invention, FIG. 2 is a cross-sectional view of the thin film transistor array panel of FIG. 1 taken along a line II-II' according to an exemplary embodiment of the present invention', and FIG. 3 is a cross-sectional view of the thin film transistor array panel of FIG. 1 taken along a line III-III' according to an exemplary embodiment of the present invention.

Figure 2:
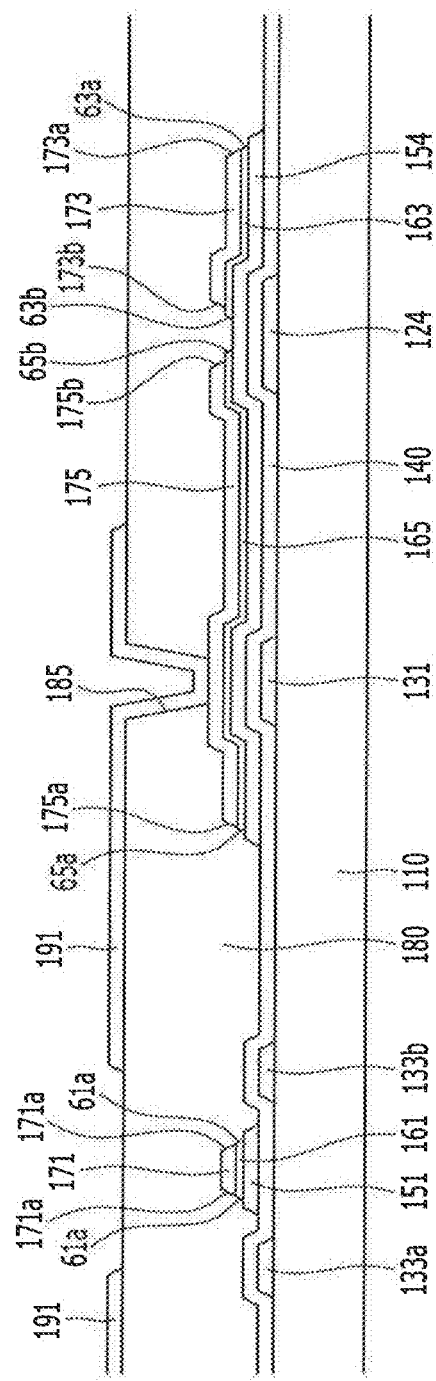
FIG. 2 is a cross-sectional view of the thin film transistor array panel of FIG. 1 taken along a line II-II' according to an exemplary embodiment of the present invention.
Figure 3:
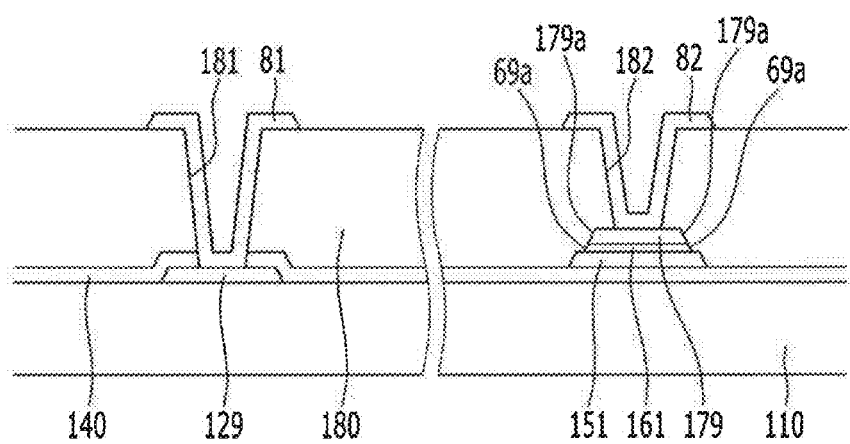
FIG. 3 is a cross-sectional view of the thin film transistor array panel of FIG. 1 taken along a line III-III' according to an exemplary embodiment of the present invention.

Referring to FIG. 1 to FIG. 3, a plurality of gate lines 121 and a plurality of storage electrode lines 131 are disposed on an insulation substrate 110 made of a transparent glass or plastic.

The gate line 121 transmits a gate signal and extends in a transverse direction. Each gate line 121 includes a plurality of gate electrodes 124 protruding downward and a gate pad 129 having a wide area for connection with other layers or an external driving circuit. A gate driving circuit that generates the gate signal may be mounted on a flexible printed circuit film adhered on the substrate 110, may be directly mounted on the substrate 110, or may be integrated with the substrate 110. When the gate driving circuit is integrated with the substrate 110, the gate lines 121 may extend along the substrate 100, and then, be directly connected to the gate driving circuit.

The storage electrode lines 131 receive a predetermined voltage and include a stem extending parallel to the gate lines 121, and a plurality of pairs of first and second storage electrodes 133a and 133b branching off from the stem. Each of the storage electrode lines 131 is disposed between two adjacent gate lines 121, and its stem is placed closer to the lower of the two adjacent gate lines 121. Each of the first and second storage electrodes 133a and 133b has a fixed end connected to the stem and a free end opposite to the fixed end. The fixed end of the first storage electrode 133a has a wide area, and the free end of the first storage electrode 133a is straight. The first end of the second storage electrode 133b has a wide area, and the free end of the second storage electrode 133b is divided into two portions of a straight portion and a bent portion. However, the shape and arrangement of the storage electrode lines 131 may be variously changed.

The gate lines 121 and the storage electrode lines 131 may be made of an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), titanium (Ti), etc. However, the gate lines 121 and the storage electrode lines 131 may have a multi-layered structure including two conductive films having different physical characteristics. One conductor layer among the two conductive films is made of a metal having low resistivity, for example aluminum-based metals, silver-based metals, copper-based metals, etc. This conductor may include these materials to reduce signal delay or voltage drop. Alternatively, the other conductor layer of the two conductive films is made of materials having good or excellent physical, chemical, and/ or electrical contact characteristics with other materials, for example, molybdenum-based metals, chromium (Cr), tantalum (Ta), titanium (Ti), etc., indium tin oxide (ITO) or indium zinc oxide (IZO). An example of such a combination may include a chromium lower layer and an aluminum (alloy) upper layer, and an aluminum (alloy) lower layer and a molybdenum (alloy) upper layer. However, the gate conductors 121 and 131 may be made of various other metals or electrical conductors.

The sides of the gate lines 121 and the sides of the storage electrode lines 131 are sloped to the surface of the substrate 110, and the slope angle is about 30 degrees to about 80 degrees.

A gate insulation layer 140 made of a silicon nitride (SiNx) or a silicon oxide (SiOx), etc., is disposed on the gate lines 121 and the storage electrode lines 131.

A plurality of semiconductor layers 151 that are made of hydrogenated amorphous silicon (a-Si), polysilicon, etc. are disposed on the gate insulating layer 140. The semiconductor layer 151 extends in a longitudinal direction, overlaps a data line 171 that will be described later, and includes a plurality of projections 154 extending toward the gate electrode 124.

A plurality of ohmic contacts 161, 163, and 165 are disposed on the semiconductor layer 151. The ohmic contacts 161, 163, and 165 may be made of a material such as phosphorus or a silicide. The first ohmic contact 161 is disposed on the semiconductor layer 151, and the second ohmic contact 163 and the third ohmic contact 165 are disposed as a pair on the projections 154 of the semiconductor layer 151.

The sides of the semiconductor layer 151 and the ohmic contacts 161, 163, and 165 are sloped to the surface of the substrate 110, and the slope angle is about 30 degrees to about 80 degrees.

A plurality of data lines 171 and a plurality of drain electrodes 175 are disposed on the ohmic contacts 161, 163, and 165.

The data line 171 transfers a data signal and extends in the longitudinal direction to cross the gate line 121. Each data line 171 also crosses the storage electrode line 131 to run between sets of adjacent first and second storage electrodes 133a and 133b. Each data line 171 includes a plurality of source electrodes 173 which extend toward the gate electrode 124, and a data pad 179 for connecting with another layer or an external driving circuit. A data driving circuit for generating a data signal may be installed on a flexible printed circuit film attached to the substrate 110, installed directly on the substrate 110, or integrated with the substrate 110. When the data driving circuit is integrated with the substrate 110, the data line 171 may be extended along the substrate 110 to be directly connected to the data driving circuit.

The drain electrode 175 is separated from the data line 171 and faces the source electrode 173 with respect to the gate electrode 124. Each drain electrode 175 includes a wide end portion and a rod-shaped end portion. The wide end portion overlaps with the storage electrode line 131, and the rod-shaped end portion is partially surrounded by the curved source electrode 173.

One gate electrode 124, one source electrode 173, and one drain electrode 175 form one thin film transistor (TFT) together with the projection 154 of the semiconductor layer 151. A channel of the thin film transistor is disposed in the projection 154 between the source electrode 173 and the drain electrode 175.

When viewing the top of the substrate 110 in the direction perpendicular to the surface of the substrate 110 in a plan view, edges 61a and 69a of the first ohmic contact 161 disposed under the data line 171 and the data pad 179 are barely protruded from an edge 171a of the data line 171 and an edge 179a of the data pad 179. Similarly, a first edge 63a of the second ohmic contact 163 disposed under the source electrode 173 is barely protruded from a first edge 173a of the source electrode 173, and a first edge 65a of the third ohmic contact 165 disposed under the source electrode 173 is barely protruded from a first edge 175a of the drain electrode 175. However, in comparison to the above, a second edge 63b of the second ohmic contact 163 and a second edge 65b of the third ohmic contact 165 facing each other in the channel part are protruded farther from a second edge 173b of the source electrode 173 and a second edge 175b of the drain electrode 175. In other words, when viewing the top of the substrate 110 in the direction perpendicular to the surface of the substrate 110 in the plan view, the edges 63b and 65b of the second ohmic contact 163 and the third ohmic contact 165 adjacent to the channel part are protruded from the source electrode 173 and the drain electrode 175, and thus, the width of these projections is larger than the width of the projections of the edges 61a, 63a, and 65a of the underlying first ohmic contact 161, the second ohmic contact 163, and the third ohmic contact 165.

The data line 171 and the drain electrode 175 are made of a refractory metal such as molybdenum, chromium, tantalum, and titanium, or their alloys. The data conductors 171, 175a, and 175b may have a multilayer structure including a refractory metal layer and a low resistance conductive layer. A multilayer structure includes, for example, a dual-layer of a chromium or molybdenum (alloy) lower layer and an aluminum (alloy) upper layer, and a triple-layer of a molybdenum (alloy) lower layer, an aluminum (alloy) middle layer, and a molybdenum (alloy) upper layer. However, the data conductors 171, 175a, and 175b may be made of other various metals or conductors. In an exemplary embodiment of the present invention, a first protection member, a second protection member, a third protection member, and a fourth protection member may covers the sides of the data line 171, the source electrode 173, the drain electrode 175, and the data pad 179, respectively. The first protection member, the second protection member, the third protection member, and the fourth protection member may include the same material as the gate insulating layer 140 or the same material as the first ohmic contact 161 and the second ohmic contact 163.

Sides of the data line 171 and the drain electrode 175 are inclined to the surface of the substrate 110, and an inclination angle thereof is about 30 degrees to about 80 degrees.

The ohmic contacts 161, 163, and 165 may exist only between the semiconductor layer 151 therebelow and the data lines 171 and drain electrodes 175 thereabove to reduce a contact resistance between the semiconductor layer 151 and the data lines 171 and drain electrodes 175.

The semiconductor layer 151 may include an oxide semiconductor, and when the semiconductor layer 151 includes the oxide semiconductor, the ohmic contacts 161, 163, and 165 may be omitted.

When viewed in the direction perpendicular to the surface of the substrate 110, except for the channel part, the plane shape formed by the edge of the semiconductor layer 151 is similar to the plane shape formed the edges of the data line 171, the drain electrode 175, and the underlying ohmic contacts 161 and 165. However, the part of the projection 154 of the semiconductor layer 151 forming the channel part is disposed between the source electrode 173 and the drain electrode 175.

In the present exemplary embodiment, the gate electrode 124 is disposed under the semiconductor layer 151 and the source electrode 173 and drain electrode 175 are disposed on the semiconductor layer 151, however the present invention is not limited thereto. For example, the gate electrode 124 may overlap the semiconductor layer 151 and the source electrode 173 and drain electrode 175 may overlap the semiconductor layer 151.

A passivation layer 180 is disposed on the data line 171, the drain electrode 175, and a part of the projection 154 of the semiconductor layer 151.

The passivation layer 180 is made of an inorganic insulator, an organic insulator, etc., and may have a flat surface. The inorganic insulator includes, for example, a silicon nitride or a silicon oxide. The organic insulator may have photosensitivity and a dielectric constant of about 4.0 or less. However, the passivation layer 180 may have a dual-layer structure of a lower inorganic layer and an upper organic layer so as not to cause damage to an exposed portion of the semiconductor layer 151, while having excellent insulating characteristics of the organic layer.

The passivation layer 180 has a plurality of contact holes 182 and 185 respectively exposing the data pad 179 of the data line 171 and the drain electrode 175. The passivation layer 180 and the gate insulating layer 140 have a plurality of contact holes 181 exposing the gate pad 129 of the gate line 121, a plurality of contact holes 184 exposing a part of the storage electrode line 131 near the fixed end of the first storage electrode 133a, and a plurality of contact holes 184 exposing the free end projection of the first storage electrode 133a.

A plurality of pixel electrodes 191, a plurality of overpasses 84, and a plurality of contact assistants 81 and 82 are disposed on the passivation layer 180. They may be made of a transparent conductive material such as ITO or IZO, or a reflective metal such as aluminum, silver, or alloys thereof.

The pixel electrode 191 is physically and electrically connected to the drain electrode 175 through the contact hole 185 such that it is applied with a data voltage from the drain electrode 175. The pixel electrodes 191 to which a data voltage is applied and a common electrode of another display panel that receives a common voltage generate an electric field, thereby determining a direction of liquid crystal molecules of a liquid crystal layer between the two electrodes. Since the pixel electrodes 191 and the common electrode form a capacitor (which hereinafter may be referred to as a "liquid crystal capacitor"), an applied voltage is sustained after a thin film transistor is turned off.

The pixel electrode 191 overlaps the storage electrode line 131 as well as the first and second storage electrodes 133a and 133b. A capacitor, which is formed of the pixel electrode 191 and the drain electrode 175 electrically connected to the pixel electrode 191, overlaps the storage electrode line 131, and is referred to as a storage capacitor. The storage capacitor increases a voltage sustaining capability of the liquid crystal capacitor.

The contact assistants 81 and 82 are connected with the gate pad 129 of the gate line 121 and the data pad 179 of the data line 171 through the contact holes 181 and 182, respectively.

The overpass 84, traversing the gate line 121, is connected with the exposed portion of the storage electrode line 131 and the exposed end portion of the free end of the second storage electrode 133b via a pair of contact holes 184 disposed at the other side of the gate line 121. The storage electrode line 131 as well as the first and second storage electrodes 133a and 133b can be used together with the overpass 84 to repair a defect of the gate line 121, the data line 171, or the thin film transistor.

Next, a manufacturing method of the thin film transistor array panel according to an exemplary embodiment of the present invention will be described with reference to FIG. 4 to FIG. 29 as well as FIG. 1 to FIG. 3.

Figure 4:
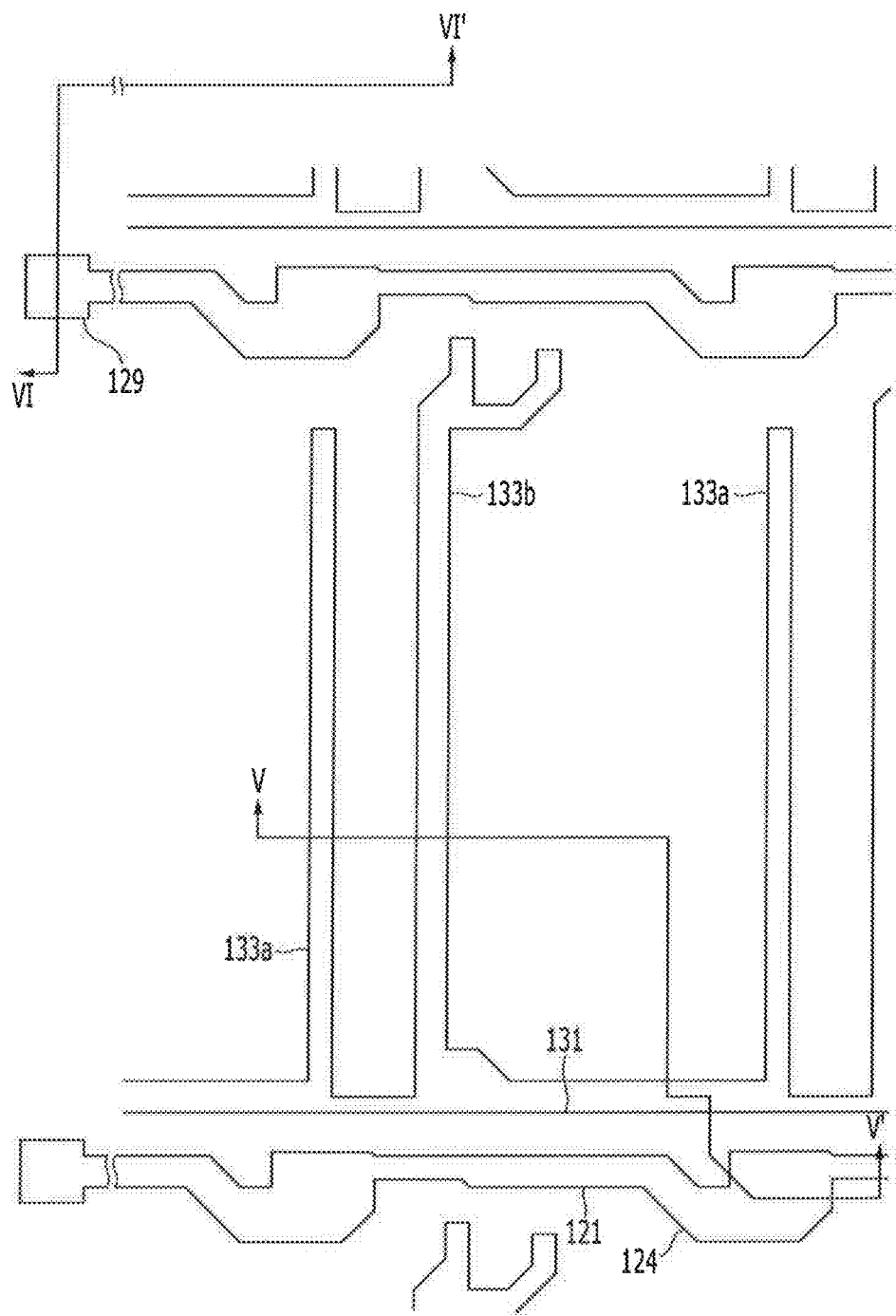
FIG. 4, FIG. 7, and FIG. 27 are layout views sequentially showing a manufacturing method of a thin film transistor array panel according to an exemplary embodiment of the present invention.
Figure 5:
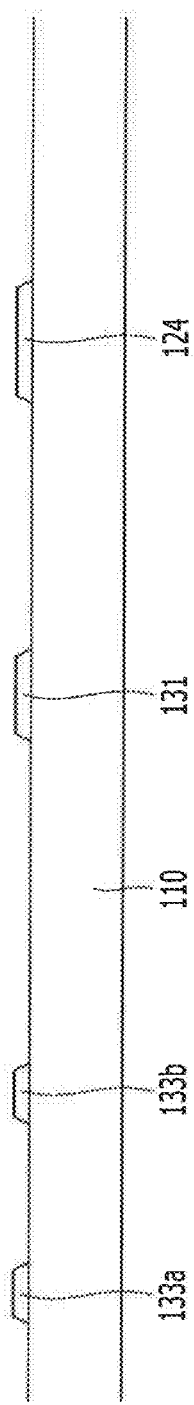
FIG. 5 is a cross-sectional view of the thin film transistor array panel of FIG. 4 taken along a line V-V' according to an exemplary embodiment of the present invention.
Figure 6:
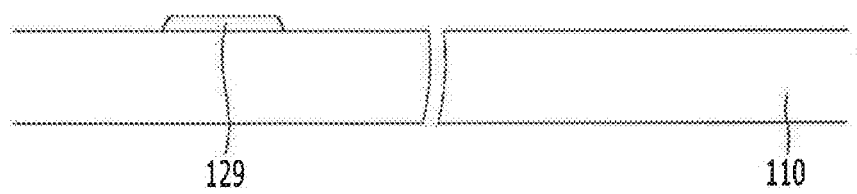
FIG. 6 is a cross-sectional view of the thin film transistor array panel of FIG. 4 taken along a line VI-VI' according to an exemplary embodiment of the present invention.
Figure 7:
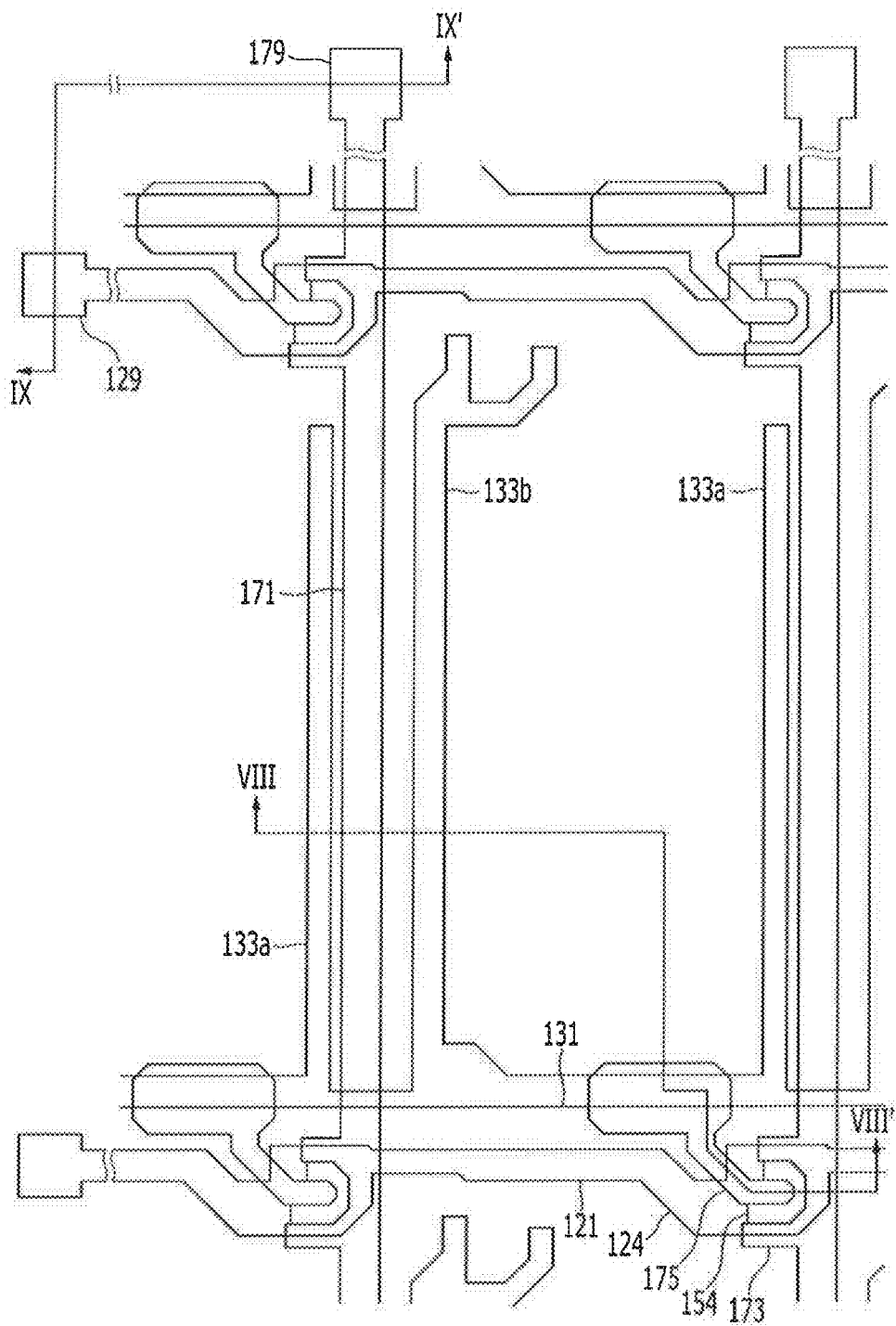
Figure 8:
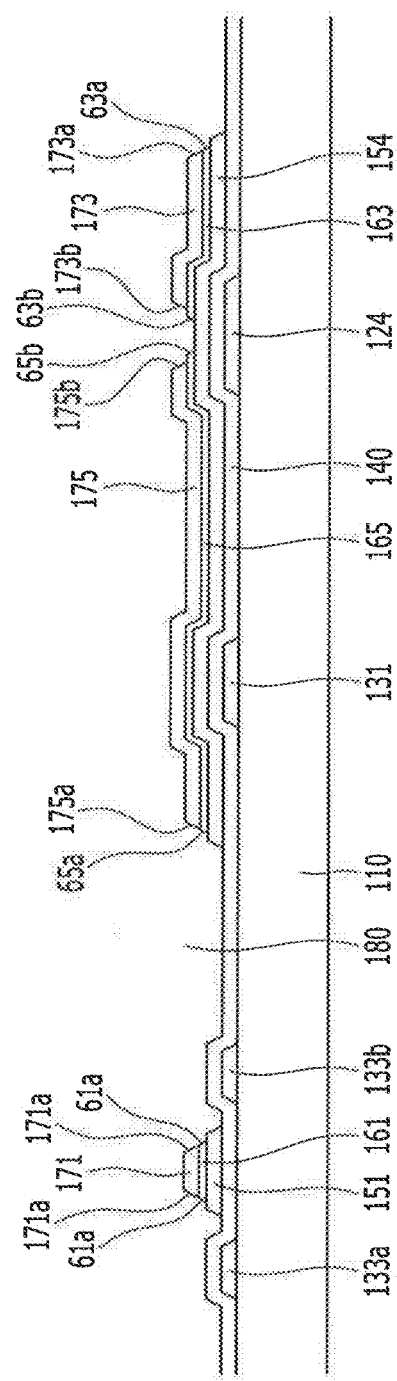
FIG. 8 is a cross-sectional view of the thin film transistor array panel of FIG. 7 taken along a line VIII-VIII' according to an exemplary embodiment of the present invention.
Figure 9:
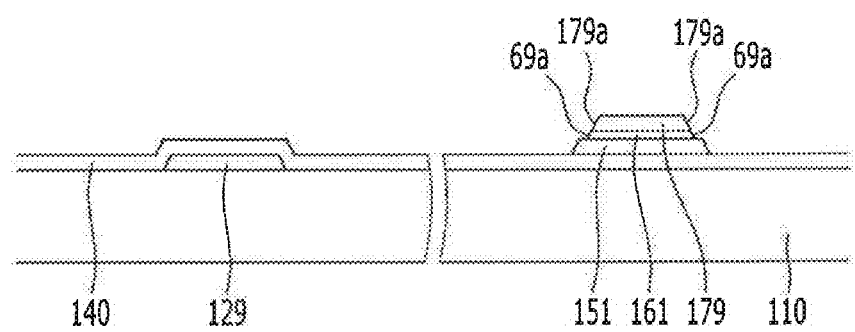
FIG. 9 is a cross-sectional view of the thin film transistor array panel of FIG. 7 taken along a line IX-IX' according to an exemplary embodiment of the present invention.
Figure 27:
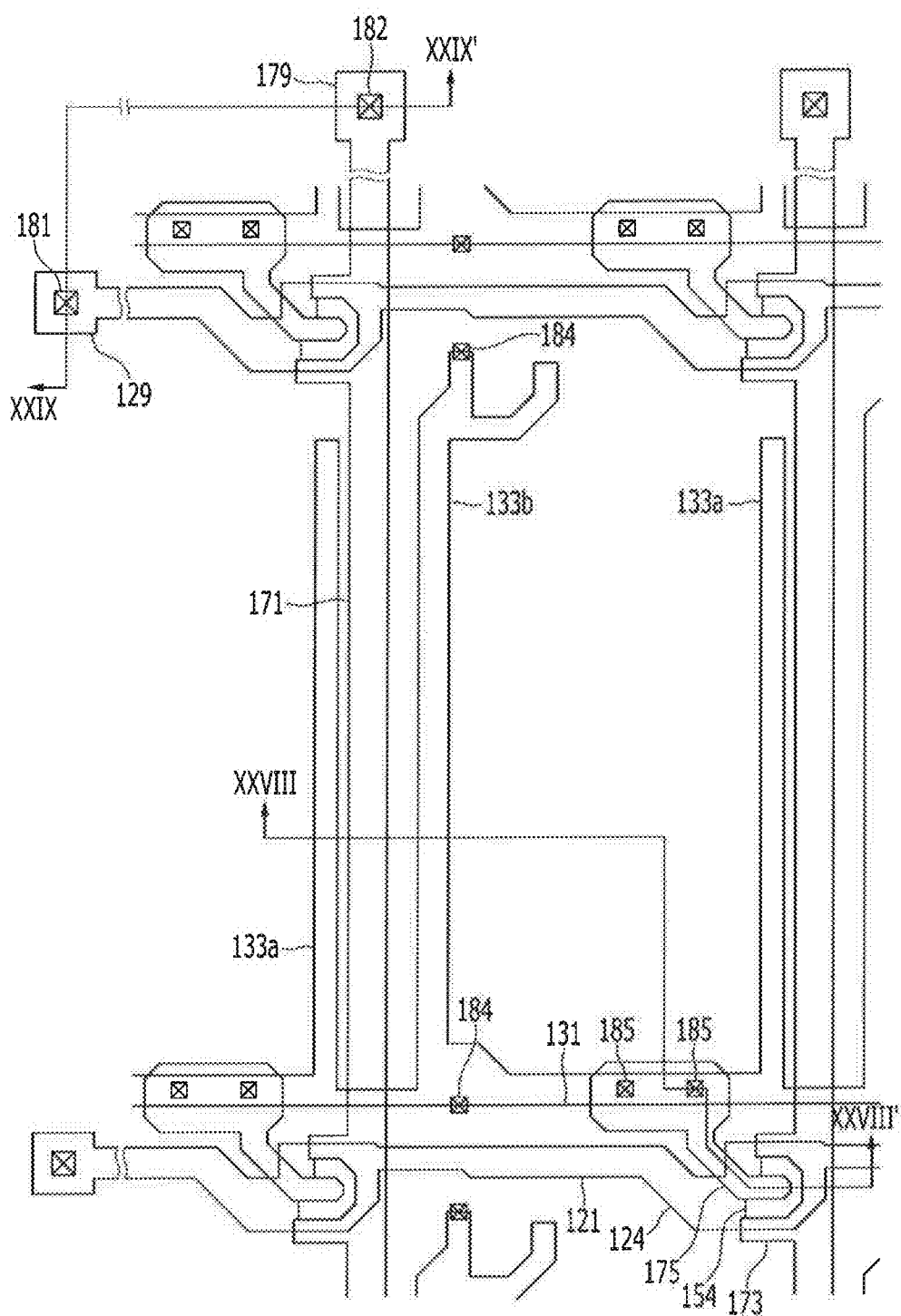
Figure 28:
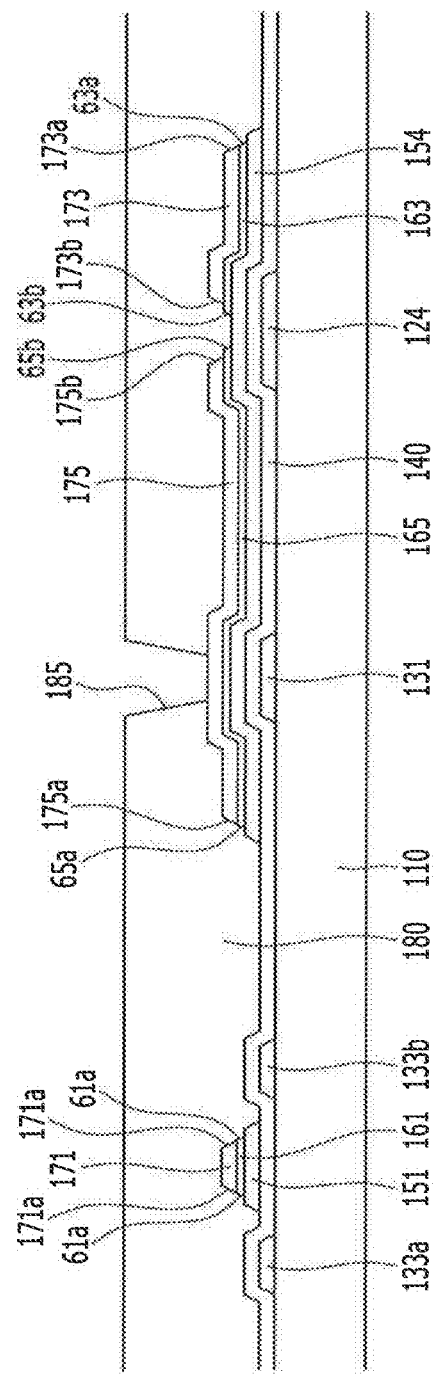
FIG. 28 is a cross-sectional view of the thin film transistor array panel of FIG. 27 taken along a line XXVIII-XXVIII' according to an exemplary embodiment of the present invention.
Figure 29:
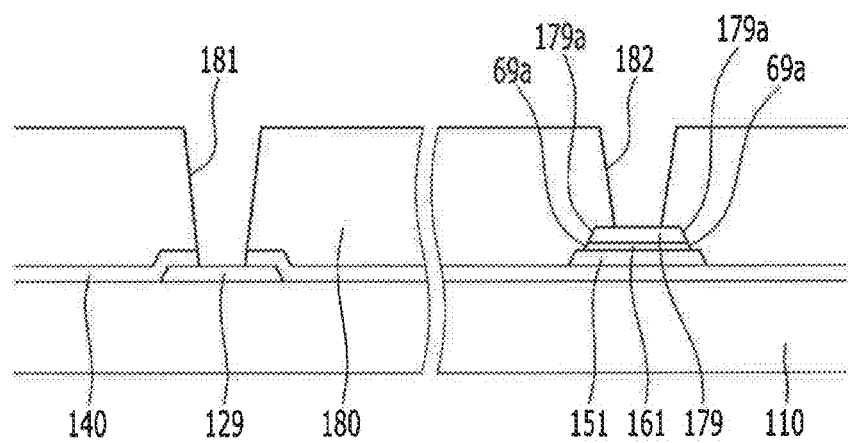
FIG. 29 is a cross-sectional view of the thin film transistor array panel of FIG. 27 taken along a line XXIX-XXIX' according to an exemplary embodiment of the present invention.

FIG. 4, FIG. 7, and FIG. 27 are layout views sequentially showing a manufacturing method of a thin film transistor array panel according to an exemplary embodiment of the present invention. FIG. 5 is a cross-sectional view of the thin film transistor array panel of FIG. 4 taken along a line V-V' according to an exemplary embodiment of the present invention, and FIG. 6 is a cross-sectional view of the thin film transistor array panel of FIG. 4 taken along a line VI-VI' according to an exemplary embodiment of the present invention. FIG. 8 is a cross-sectional view of the thin film transistor array panel of FIG. 7 taken along a line VIII-VIII' according to an exemplary embodiment of the present invention, and FIG. 9 is a cross-sectional view of the thin film transistor array panel of FIG. 7 taken along a line IX-IX' according to an exemplary embodiment of the present invention. FIG. 10 to FIG. 25 are cross-sectional views sequentially showing a manufacturing method of the thin film transistor array panel shown in FIG. 7 to FIG. 9 according to an exemplary embodiment of the present invention. FIG. 28 is a cross-sectional view of the thin film transistor array panel of FIG. 27 taken along a line XXVII-XXVII' according to an exemplary embodiment of the present invention, and FIG. 29 is a cross-sectional view of the thin film transistor array panel of FIG. 27 taken along a line XXVIII-XXVIII'.

First, as shown in FIG. 4 to FIG. 6, a metal layer is deposited by sputtering it onto an insulation substrate 110 made of the transparent glass or plastic and patterned by photolithography to form a plurality of gate lines 121 including a gate electrode 124 and a gate pad 129 and a plurality of storage electrode lines 131 including first and second storage electrodes 133a and 133b.

Next, as shown in FIG. 7 to FIG. 9, a gate insulating layer 140 is deposited, and a semiconductor layer 151 including projections 154, a plurality of ohmic contacts 161, 163, and 165, a plurality of data lines 171 including a source electrode 173 and a data pad 179, and a plurality of drain electrodes 175 are formed.

In this case, as described above, the edges 63b and 65b of the second ohmic contact 163 and the third ohmic contact 165 disposed adjacent to the channel part of the thin film transistor are formed to be protruded from the source electrode 173 and the drain electrode 175. In this case, the width of these projections is formed to be larger than the width of the projections of the first ohmic contact 161 disposed adjacent to the outer edge near the edges 61a, 63a, and 65a of the underlying first ohmic contact 161, second ohmic contact 163, and third ohmic contact 165.

Now, the manufacturing method of the thin film transistor array panel shown in FIG. 7 to FIG. 9 will be described with reference to FIG. 10 to FIG. 25.

Figure 10:
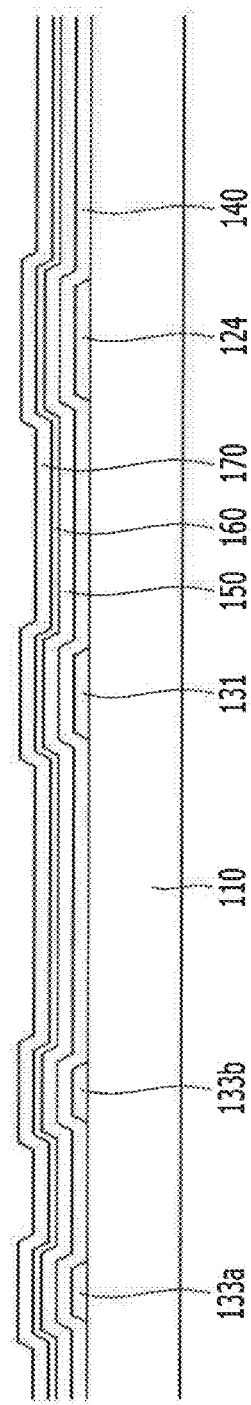
FIG. 10 to FIG. 25 are cross-sectional views sequentially showing a manufacturing method of the thin film transistor array panel shown in FIG. 7 to FIG. 9 according to an exemplary embodiment of the present invention.
Figure 11:
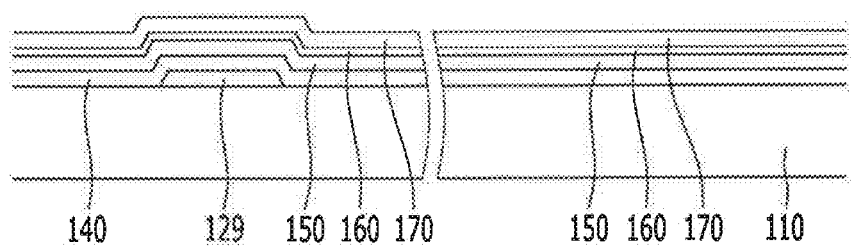

Referring to FIG. 10 and FIG. 11, on the gate insulating layer 140, an intrinsic amorphous silicon layer 150, and an amorphous silicon layer 160 doped with an impurity, are deposited by chemical vapor deposition, and a data metal layer 170 is continuously deposited thereon by sputtering.

Figure 12:
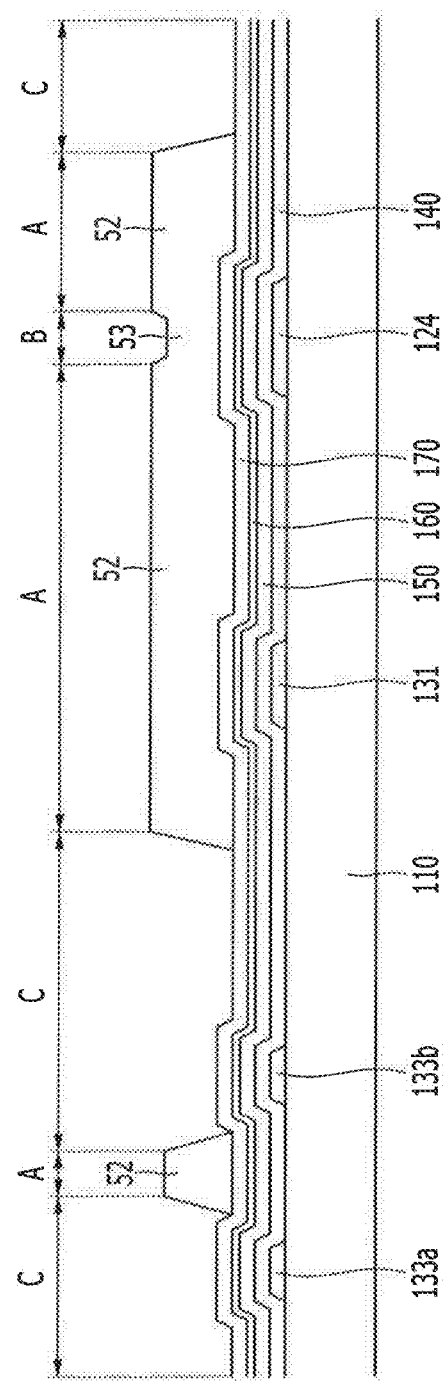
Figure 13:
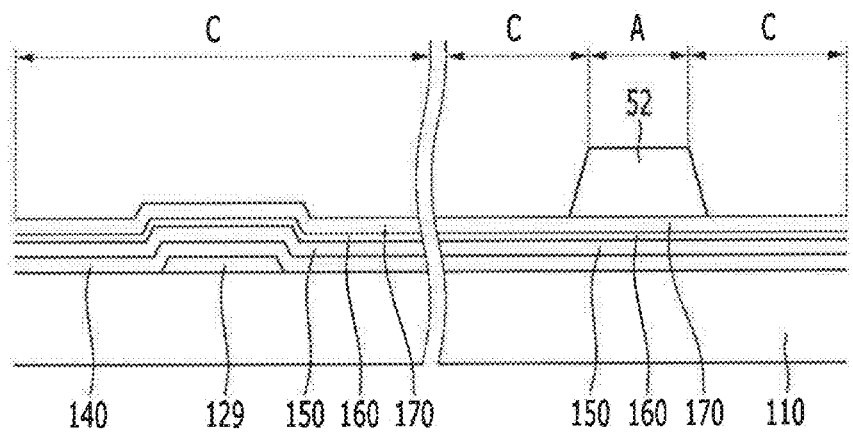

Next, as shown in FIG. 12 and FIG. 13, a photosensitive film is formed on the data metal layer 170, and is exposed and developed to form a photosensitive film pattern (52 and 53) having different thicknesses.

Here, for convenience of the description, the data metal layer 170, the impurity doped amorphous silicon layer 160, and the intrinsic amorphous silicon layer 150 of an area where a wiring will be formed are referred to as a wiring portion A, areas where the channel on the gate electrode 124 is formed are referred to as a channel portion B, and areas except for the wiring portion A and the channel portion B are referred to as a remaining portion C.

Among the photosensitive film pattern (52 and 53), a first portion 52 disposed at the wiring portion A is formed to be thicker than a second portion 53 disposed at the channel portion B, and the photosensitive film of the remaining portion C is completely removed. A ratio of the first thickness of the first portion 52 and the second thickness of the second portion 53 depends on a process condition in an etching process to be described below, and for example, the second thickness of the second portion 53 is ½ or less of the first thickness of the first portion 52.

As described above, there may be various methods for forming the photosensitive films having different thicknesses according to position. As an example thereof, a transparent area, a light blocking area, and a semi-transparent area may be disposed in an exposure mask. In the semi-transparent area, a slit pattern, a lattice pattern, or a thin film that has a middle transmittance or a middle thickness is provided. When the slit pattern is used, a width of the slit or an interval between slits is smaller than a resolution of a light exposure that is used in a photolithography process. As another example thereof, a photosensitive film that can reflow may be used. In other words, after a photosensitive film pattern that can reflow is formed by using a mask that has only a transparent region and a light blocking region, the reflow is performed, such that the photosensitive film is allowed to flow down into a region in which the photosensitive film does not remain, thus forming a thin part.

Figure 14:
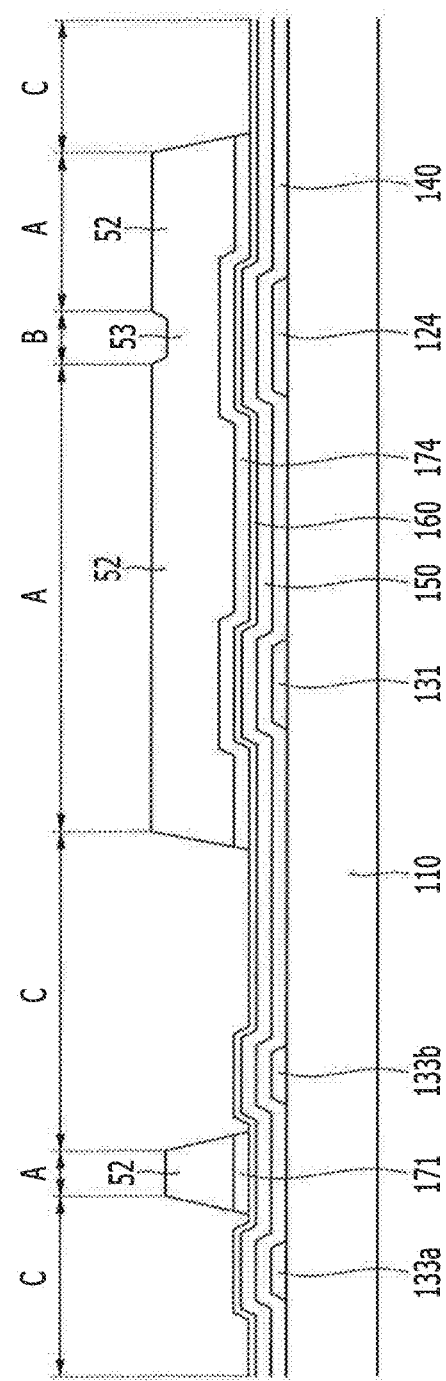
Figure 15:
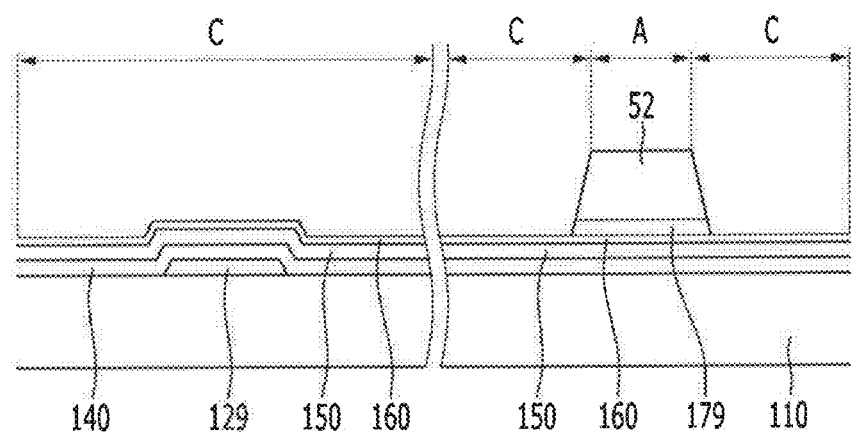

Next, as shown in FIG. 14 and FIG. 15, the data metal layer 170 that is exposed at the remaining portion C is removed by wet etching by using the first portion 52 of the photosensitive film pattern as an etching mask to form the data line 171, the data pad 179, and a data metal pattern 174.

Figure 16:
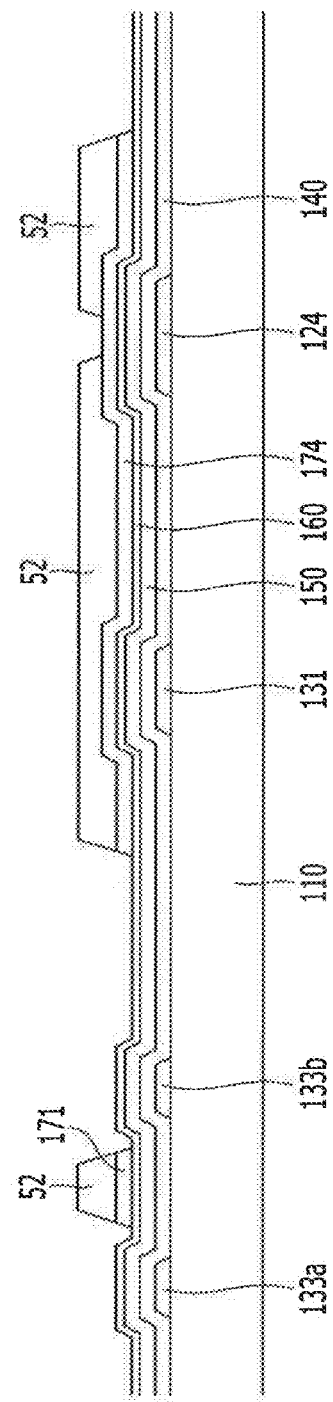
Figure 17:
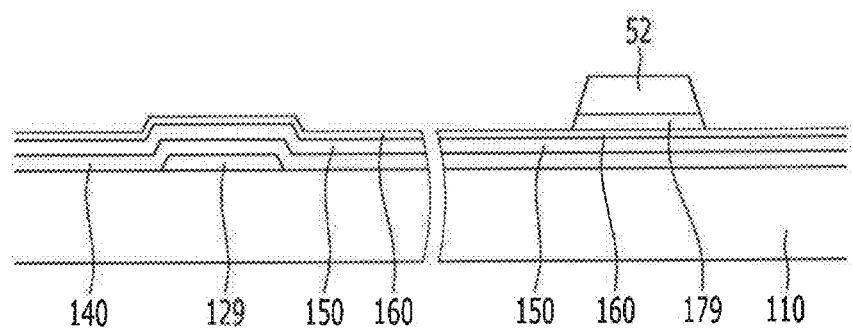

Referring to FIG. 16 and FIG. 17, the second portion 53 of the photosensitive film pattern existing at the channel portion B is removed by using an etch-back process. In this case, the thickness of the first portion 52 of the photosensitive film pattern is decreased.

Figure 18:
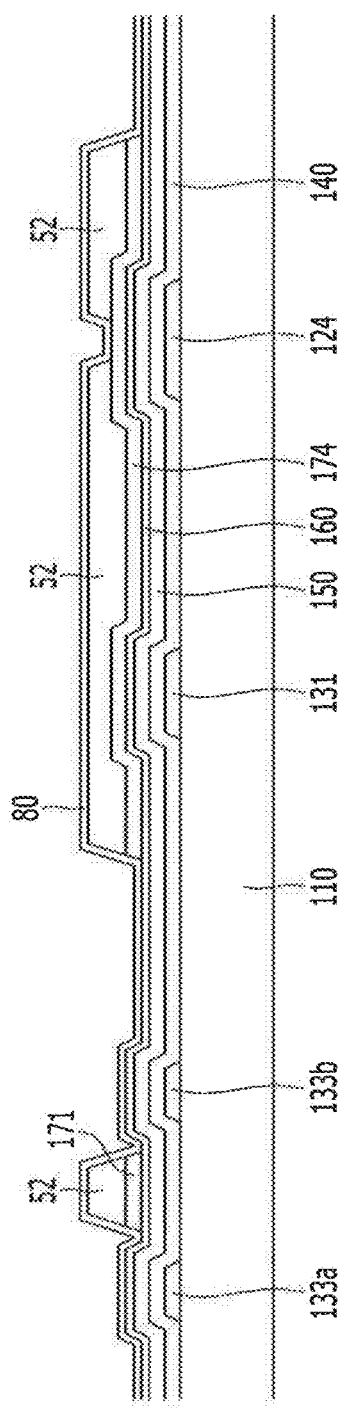
Figure 19:
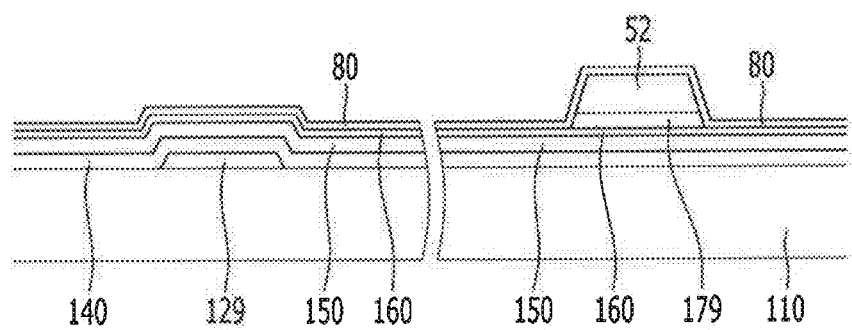

Next, as shown in FIG. 18 and FIG. 19, an insulating layer 80 is deposited on the entire surface of the substrate 110 by using chemical vapor deposition (CVD).

The insulating layer 80 may include a material that may be etched by an etchant for etching the data metal layer 170. For example, the insulating layer 80 may include the same material as the impurity doped amorphous silicon layer 160 or the gate insulating layer 140.

Figure 20:
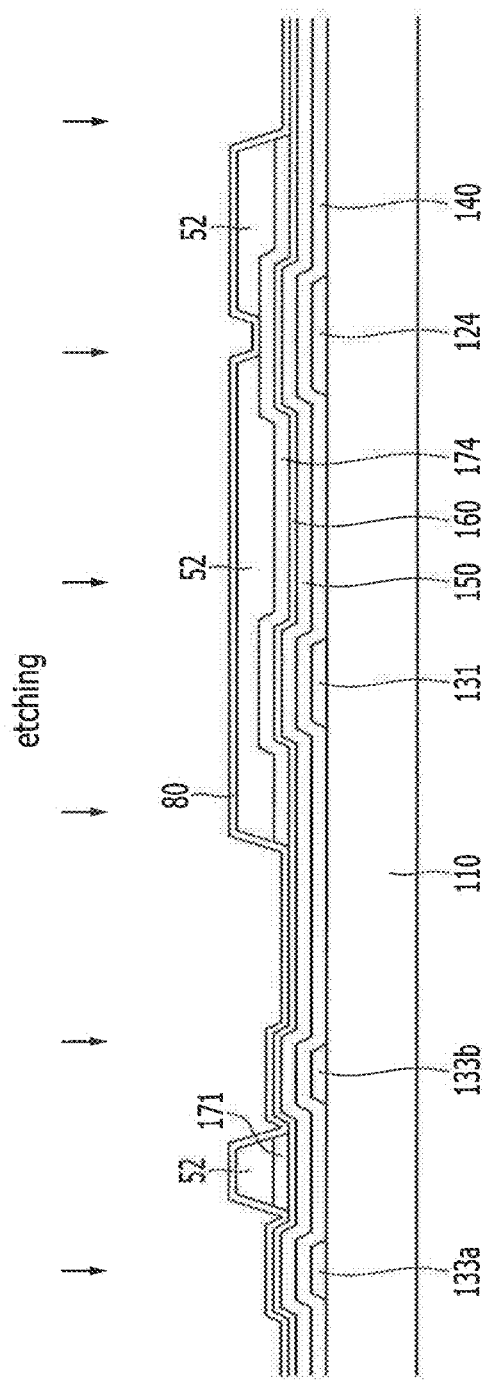
Figure 21:
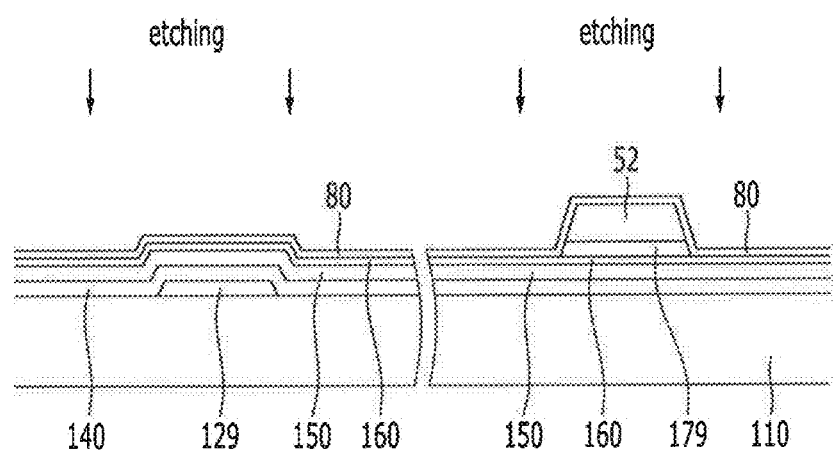
Figure 22:
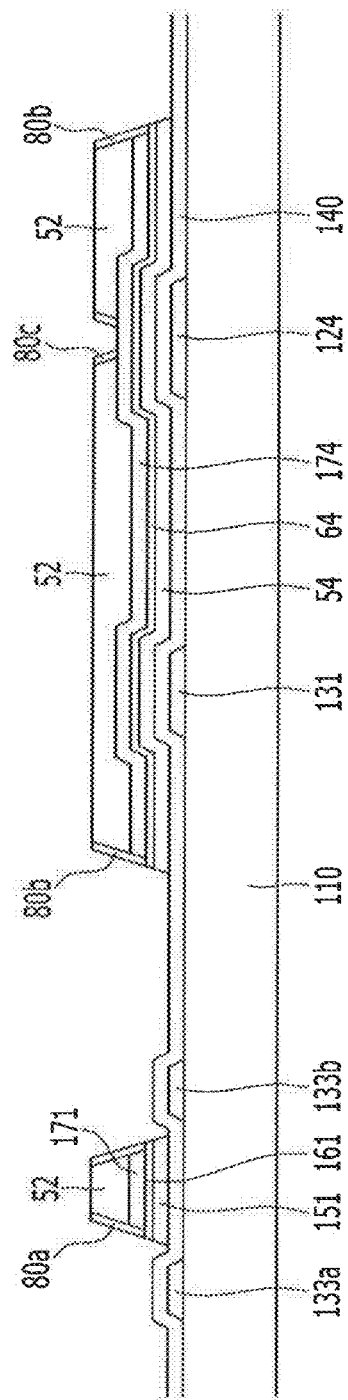
Figure 23:
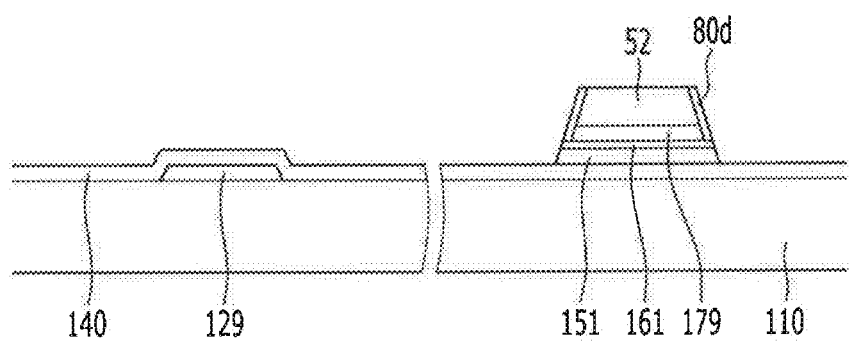

Next, referring to FIG. 20 and FIG. 21, a dry etching is performed in a direction perpendicular to the surface of the substrate 110 by using the first portion 52 of the photosensitive film pattern as the mask. By dry etching in the direction perpendicular to the surface of the substrate 110, as shown in FIG. 22 and FIG. 23, the insulating layer 80, the impurity doped amorphous silicon layer 160, and the intrinsic amorphous silicon layer 150 are removed to form the semiconductor layer 151 and the first ohmic contact 161 and to form an intrinsic amorphous silicon pattern 54 and an impurity doped amorphous silicon pattern 64 disposed under the data metal pattern 174.

In this case, the dry etching uses a low voltage and a high bias power, and is performed by using a material having a heavy molecular weight and a combination that does not break well as well as an anisotropic etching characteristic (e.g., a physical etch).

By etching the insulating layer 80, the impurity doped amorphous silicon layer 160, and the intrinsic amorphous silicon layer 150 by the aforementioned dry etching using the anisotropic etching characteristic, the first portion 52 of the photosensitive film pattern and the insulating layer 80 disposed at the surface of the impurity doped amorphous silicon layer 160 are removed. However, the insulating layer 80 covering the side of the first portion 52 of the photosensitive film pattern and a plurality of data lines 171 including the source electrode 173 and the data pad 179, and a plurality of drain electrodes 175 remains. Accordingly, a first insulating layer 80a remains at the side of the data line 171 and the first portion 52 of the photosensitive film pattern disposed on the data line 171, a second insulating layer 80b remains at the side of the data metal pattern 174 and the outer edge of the first portion 52 of the photosensitive film pattern thereon, a third insulating layer 80c remains at the side of the inner edge of the first portion 52 of the photosensitive film pattern, and a fourth insulating layer 80d remains at the side of the data pad 179 and the first portion 52 of the photosensitive film pattern thereon.

In this way, by removing the impurity doped amorphous silicon layer 160 and the intrinsic amorphous silicon layer 150, before forming the semiconductor layer 151, the first ohmic contact 161, the intrinsic amorphous silicon pattern 54, and the impurity doped amorphous silicon pattern 64 disposed under and the data metal pattern 174, after depositing the insulating layer 80, by performing the dry etching in the direction perpendicular to the surface of the substrate 110 by using the anisotropic dry etching, because the second insulating layer 80b remains at the side of the data metal pattern 174 while forming the intrinsic amorphous silicon pattern 54 and the impurity doped amorphous silicon pattern 64, the data metal pattern 174 is not etched. Accordingly, a component of the data metal pattern 174 is not diffused or flowed into the intrinsic amorphous silicon pattern 54 and the impurity doped amorphous silicon pattern 64. Further, the edge of the intrinsic amorphous silicon pattern 54 and the impurity doped amorphous silicon pattern 64 are almost overlapped by the edge of the data metal pattern 174.

Figure 24:
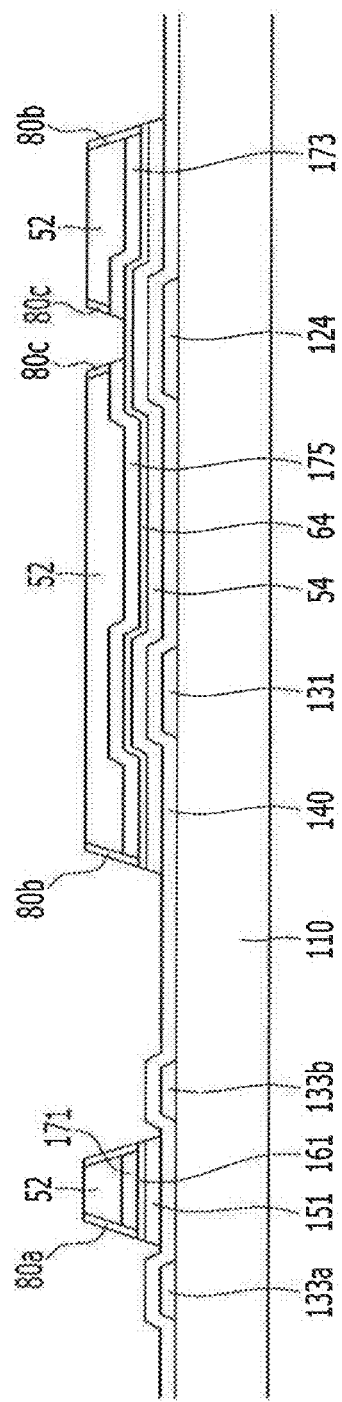
Figure 25:
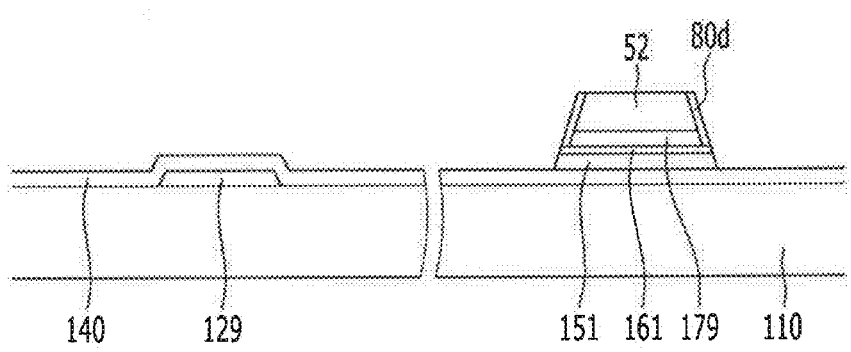

Next, as shown in FIG. 24 and FIG. 25, the wet etching is performed by using the first portion 52 of the photosensitive film pattern as the etching mask to wet-etch the data metal pattern 174 disposed at the channel part, thereby forming the data line 171 including the source electrode 173 and the data pad 179, and the drain electrode 175. Next, the impurity doped amorphous silicon pattern 64 is wet etched to form a plurality of ohmic contacts 161, 163, and 165 and to expose the projection 154 of the semiconductor layer 151 of the channel part. The data metal pattern 174 and the impurity doped amorphous silicon pattern 64 may be completely etched by the same etchant.

In this case, the first insulating layer 80a disposed at the side of the data line 171 and the first portion 52 of the photosensitive film pattern disposed on the data line 171, the second insulating layer 80b disposed at the side of the data metal pattern 174 and the outer edge of the first portion 52 of the photosensitive film pattern thereon, the third insulating layer 80c disposed at the side of the inner edge of the first portion 52 of the photosensitive film pattern, and the fourth insulating layer 80d disposed at the side of the data pad 179 and the first portion 52 of the photosensitive film pattern thereon are all removed. However, in another exemplary embodiment of the present invention, the first insulating layer 80a disposed at the side of the data line 171 and the first portion 52 of the photosensitive film pattern disposed on the data line 171, the second insulating layer 80b disposed at the side of the data metal pattern 174 and the outer edge of the first portion 52 of the photosensitive film pattern thereon, the third insulating layer 80c disposed at the side of the inner edge of the first portion 52 of the photosensitive film pattern, and the fourth insulating layer 80*d* disposed at the side of the data pad 179 and the first portion 52 of the photosensitive film pattern thereon may be partially removed and parts thereof may remain.

In this case, when parts of the insulating layer remain, by subsequently removing the photosensitive film pattern, the insulating layer positioned at the side of the photosensitive film pattern is also removed, and thus, the parts of the insulating layer do not remain at the upper surface of the data line 171, the data pad 179, the source electrode 173, and the drain electrode 175. Instead, parts of the insulating layer only remain at certain sides thereof. For example, the insulating layer is not disposed at the side of the source electrode 173 and the drain electrode 175 facing each other at the channel part. The remaining portions of the first insulating layer 80*a*, the second insulating layer 80*b*, the third insulating layer 80*c*, and the fourth insulating layer 80*d* become a first protection member, a second protection member, a third protection member, and a fourth protection member covering the sides of the data line 171, the source electrode 173, the drain electrode 175, and the data pad 179, respectively.

The insulating layer is not disposed at the side of the second edge 173*b* of the source electrode 173 or the second edge 175*b* of the drain electrode 175, however since the insulating layers 80*a*, 80*b*, 80*c*, and 80*d* are disposed at the side of the first edge 173*a* of the source electrode 173, the first edge 175*a* of the drain electrode 175 and the edges 171*a* and 179*a* of the data line 171 and the data pad 179, when wet etching the impurity doped amorphous silicon pattern 64, the second edge 173*b* of the source electrode 173 and the second edge 175*b* of the drain electrode 175 are also partially etched. Accordingly, as described above, the edges 63*b* and 65*b* of the second ohmic contact 163 and the third ohmic contact 165 adjacent to the channel part are formed to be protruded from the edges 173*b* and 175*b* of the source electrode 173 and the drain electrode 175. In addition, the width of the projection thereof is formed to be larger than the width of the projections of the edges 61*a*, 63*a*, and 65*a* of the underlying first ohmic contact 161, the second ohmic contact 163, and the third ohmic contact 165.

Next, a protection member of a thin film transistor substrate manufactured according to the manufacturing method of the thin film transistor array panel described above will be described with reference to FIG. 26A and FIG. 26B. In particular, FIG. 26A and FIG. 26B are electron-microscopic photographs showing a part of a thin film transistor substrate manufactured according to a manufacturing method of the thin film transistor array panel shown in FIG. 10 to FIG. 25.

Figure 26A:
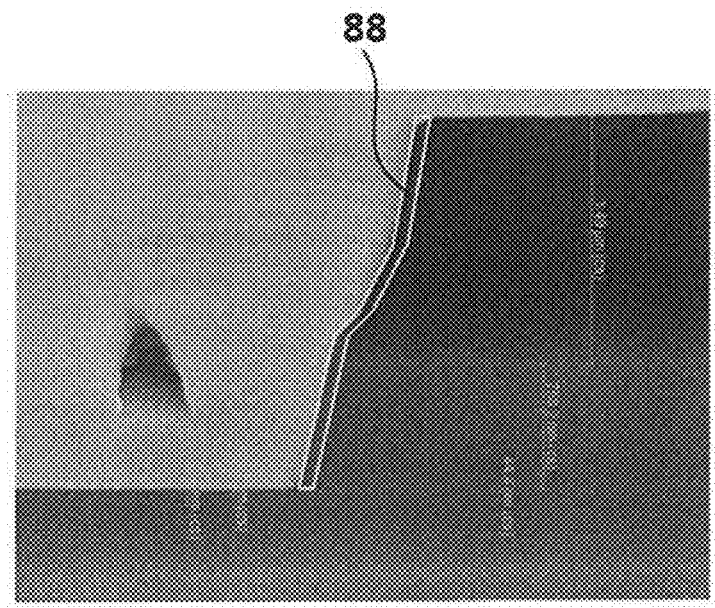
FIG. 26A and FIG. 26B are electron-microscopic photographs showing a part of a thin film transistor substrate manufactured according to a manufacturing method of the thin film transistor array panel shown in FIG. 10 to FIG. 25.
Figure 26B:
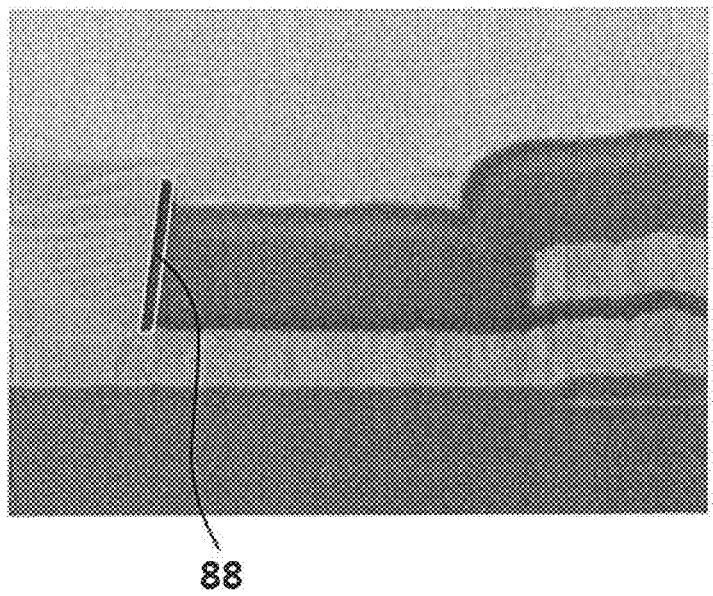

FIG. 26A shows the side of the data line before removing the photosensitive film pattern, and FIG. 26B shows the side of the data line after removing the photosensitive film pattern. Referring to FIG. 26A, an insulating layer 88 remains at the side of the data line and the side of the photosensitive film pattern. Referring to FIG. 26B, while the photosensitive film pattern is removed, the protection layer that remains at the photosensitive film pattern is removed together therewith, therefore it can be seen that the protection layer does not remain at the upper surface of the data line and only the insulating layer 88 remains at the side of the data line. In this way, by performing the dry etching in the direction perpendicular to the surface of the substrate 110, the insulating layer may only be formed at the side of the data metal layer except for the upper surface of the data metal layer.

Next, referring to FIG. 27 to FIG. 29, the passivation layer 180 is formed to cover the projection 154 of the semiconductor layer 151 that is not covered by the data line 171 and the drain electrode 175. The passivation layer 180 is etched by photolithography to form a plurality of contact holes 181, 182, 184, and 185.

Subsequently, as shown in FIG. 1 to FIG. 3, a transparent conductive material such as ITO or IZO is deposited by sputtering it onto the passivation layer 180, and is patterned to form the pixel electrode 191, the contact assistants 81 and 82, and the overpasses 84.

As described above, in the manufacturing method of the thin film transistor array panel according to an exemplary embodiment of the present invention, before forming the semiconductor layer and the ohmic contacts, after depositing the insulating layer at the side of the data metal layer and at the upper surface and the side of the photosensitive film pattern, when the dry etching is performed in the direction perpendicular to the surface of the substrate 110 by using the anisotropic dry etching, since the protection member remains at the side of the data metal layer while forming the semiconductor layer and the first ohmic contact, the data metal layer is not etched. Accordingly, a component of the data metal is not diffused and flowed into the semiconductor layer.

If, however, a component of the data metal is diffused to the semiconductor layer such that the semiconductor layer is contaminated, characteristics of the thin film transistor such as an off-current and a threshold voltage may be affected. This may appear as a residual image to a viewer. In the manufacturing method of the thin film transistor array panel according to an exemplary embodiment of the present invention, since the data metal component is not diffused to the semiconductor layer, characteristics of the thin film transistor are not deteriorated due to the contamination of the semiconductor layer. In addition, since the edge of the semiconductor layer almost overlaps the edge of the data metal layer, the edge of the semiconductor layer may be covered by the opaque metal layer, thereby preventing light from flowing into the semiconductor layer while decreasing the width of a light blocking member overlapping the thin film transistor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A method for manufacturing a thin film transistor array panel, comprising:
    forming a gate electrode on a substrate;
    depositing an insulating layer on the gate electrode;
    depositing a semiconductor layer on the insulating layer;
    depositing a metal layer overlapping the semiconductor layer;
    forming a first photosensitive pattern on the metal layer;
    etching the metal layer by using the first photosensitive pattern as an etching mask to form a data metal pattern;
    forming a second photosensitive pattern by removing a portion of the first photosensitive pattern;
    depositing a protection layer on the second photosensitive pattern to form a protection member at a side of the data metal pattern;
    etching the semiconductor layer by using the second resistor pattern as an etching mask; and
    etching the data metal pattern to form a source electrode and a drain electrode.

2. The method of claim 1, wherein:
the etching of the semiconductor layer is performed after forming the protection member at the side of the data metal pattern; and
the etching of the data metal pattern is performed after etching the semiconductor layer.

3. The method of claim 1, wherein:
the etching of the semiconductor layer includes dry etching the protection layer and the semiconductor layer together.

4. The method of claim 3, wherein:
the dry etching is performed in a direction perpendicular to a surface of the substrate.

5. The method of claim 3, wherein:
the dry etching uses an etching gas including argon (Ar) or boron trichloride ($BCl_3$).

6. The method of claim 1, wherein:
the etching of the data metal pattern exposes a channel part of the semiconductor layer.

7. The method of claim 6, wherein:
the depositing of the semiconductor layer includes depositing an impurity doped semiconductor layer, and
the etching of the data metal pattern includes simultaneously wet-etching the data metal pattern and the impurity doped semiconductor layer.

8. The method of claim 7, wherein:
the protection layer, the source electrode and the drain electrode are wet-etched by the same etchant in a chemical vapor deposition (CVD) method.

9. The method of claim 8, wherein:
the protection layer and the impurity doped semiconductor layer include the same material as each other.

10. The method of claim 4, wherein:
the protection layer, the source electrode and the drain electrode are wet-etched by the same etchant in a chemical vapor deposition (CVD) method.

11. The method of claim 10, wherein:
the protection layer and the insulating layer include the same material as each other.

12. A method for manufacturing a thin film transistor array panel, comprising:
depositing an insulating layer on a substrate;
depositing a semiconductor layer on the insulating layer;
depositing a metal layer overlapping the semiconductor layer;
depositing a film pattern on the metal layer;
etching the metal layer to form a data line and a data metal pattern;
depositing a protection layer on the substrate to form a first protection member at a side of the data line and a first side of the film pattern and a second protection member at a side of the data metal pattern and a second side of the film pattern;
etching the semiconductor layer wherein etching the semiconductor layer comprises removing the protection layer from a top surface of the film pattern; and
etching the data metal pattern to form a source electrode and a drain electrode.

13. A method for manufacturing a thin film transistor array panel, comprising:
depositing an insulating layer on a substrate;
depositing a semiconductor layer on the insulating layer;
depositing a metal layer overlapping the semiconductor layer;
etching the metal layer to form a data line and a data metal pattern;
depositing a protection layer on the data line and the data metal pattern;
etching the semiconductor layer wherein etching the semiconductor layer comprises removing the protection layer above the data line while maintaining the protection layer on a sidewall of the data line; and
etching the data metal pattern to form a source electrode and a drain electrode.

* * * * *